(12) United States Patent
Saeki et al.

(10) Patent No.: US 9,284,472 B2
(45) Date of Patent: Mar. 15, 2016

(54) SICN AND SIN POLISHING SLURRIES AND POLISHING METHODS USING THE SAME

(71) Applicant: FUJIMI INCORPORATED, Aichi (JP)

(72) Inventors: Fusayo Saeki, Tualatin, OR (US); Hooi-Sung Kim, Tualatin, OR (US)

(73) Assignee: FUJIMI INCORPORATED, Aichi (JP)

( * ) Notice: Subject to any disclaimer, the term of this patent is extended or adjusted under 35 U.S.C. 154(b) by 0 days.

(21) Appl. No.: 14/453,491

(22) Filed: Aug. 6, 2014

(65) Prior Publication Data

US 2015/0044872 A1 Feb. 12, 2015

Related U.S. Application Data

(60) Provisional application No. 61/864,379, filed on Aug. 9, 2013, provisional application No. 61/872,428, filed on Aug. 30, 2013.

(51) Int. Cl.
H01L 21/302 (2006.01)
C09G 1/02 (2006.01)
H01L 21/3105 (2006.01)
H01L 21/321 (2006.01)
C09K 3/14 (2006.01)

(52) U.S. Cl.
CPC ............ *C09G 1/02* (2013.01); *C09K 3/1436* (2013.01); *C09K 3/1463* (2013.01); *H01L 21/31053* (2013.01); *H01L 21/3212* (2013.01)

(58) Field of Classification Search
CPC ........ B24B 37/00; C09K 3/14; H01L 21/304; H01L 21/3065; H01L 21/302; H01L 21/762; C03C 25/06; C03C 16/00

USPC .......... 438/689–693; 252/79.1–79.4
See application file for complete search history.

(56) References Cited

U.S. PATENT DOCUMENTS 6,099,604 A * 8/2000 Sandhu et al. .................. 51/307
6,239,032 B1 5/2001 Nakamura et al.
(Continued)

FOREIGN PATENT DOCUMENTS

EP 2 610 031 7/2013
JP 2004-214667 7/2004
(Continued)

OTHER PUBLICATIONS

Cano-Serrano et al., "Sulfonic acid-functionalized silica through quantitative oxidation of thiol groups", Chem. Commun., 246-347 (2003).

(Continued)

*Primary Examiner* — Duy Deo
*Assistant Examiner* — Maki Angadi
(74) *Attorney, Agent, or Firm* — Foley & Lardner LLP

(57) ABSTRACT

A method is disclosed for polishing a wafer with a slurry. In the method, the wafer comprises at least one of silicon carbonitride (SiCN) and silicon nitride (SiN), and further comprises one or both of silicon dioxide ($SiO_2$) and poly silicon, and a removal rate of SiCN is greater than a removal rate of poly silicon, and the removal rate of poly silicon is greater than a removal rate of $SiO_2$, and where the slurry comprises up to about 15 wt % of surface-modified colloidal silica particles which have a primary particle size of less than about 35 nm, and the surface-modified colloidal silica particles comprise a plurality of acid moieties or salts thereof.

8 Claims, 1 Drawing Sheet

(56) References Cited

U.S. PATENT DOCUMENTS

| | | | |
|---|---|---|---|
| 6,485,355 B1* | 11/2002 | Economikos et al. | 451/41 |
| 6,914,001 B2* | 7/2005 | Lee et al. | 438/692 |
| 2003/0228762 A1 | 12/2003 | Moeggenborg et al. | |
| 2004/0203252 A1 | 10/2004 | Park | |
| 2004/0209555 A1 | 10/2004 | Sun et al. | |
| 2005/0056810 A1* | 3/2005 | Bian et al. | 252/79.1 |
| 2010/0009538 A1 | 1/2010 | Kamimura | |

FOREIGN PATENT DOCUMENTS

| | | |
|---|---|---|
| JP | 2010-041037 | 2/2010 |
| JP | 2011-176773 | 9/2011 |
| WO | WO-2012/026329 | 3/2012 |

OTHER PUBLICATIONS

US Office Action on U.S. Appl. No. 14/170,365 dated Jul. 2, 2014.

Yamaguchi et al. "Novel silane coupling agents containing a photolabile 2-nitrobenzyl ester for introduction of a carboxy group", Chemistry Letters, 3: 228-229 (2000).

U.S. Office Action for U.S. Appl. No. 14/170,365 dated Nov. 20, 2015.

* cited by examiner

Poly opening gate process

SICN AND SIN POLISHING SLURRIES AND POLISHING METHODS USING THE SAME

CROSS-REFERENCE TO RELATED APPLICATIONS

The present application claims the benefit of and priority to U.S. provisional patent application Ser. No. 61/864,379 filed on Aug. 9, 2013 and U.S. provisional application Ser. No. 61/872,428 filed on Aug. 30, 2013, which are hereby incorporated by reference in their entireties.

TECHNOLOGY FIELD

The technology provided herein relates to polishing SiCN and SiN thin films, e.g., on semiconductor wafers.

BACKGROUND ART

Silicon carbonitride (nitrogen-doped silicon carbide (SiC) or SiCN) thin films are attractive because they perform similarly to silicon nitride (SiN) but enable lower capacitance. These films are used as etch stops, dielectric layers, and diffusion barriers in semiconductor technology such as poly opening polishing process as shown in FIG. 1. There is a need to achieve selectivity between removal rates of SiCN and silicon dioxide ($SiO_2$) with silica particles. Also, there is a need to minimize $SiO_2$ loss in an array.

SUMMARY

Provided herein are SiCN or SiN polishing slurries and polishing method using the same. In some embodiments, surface-modified colloidal silica particles (which, in some embodiments are negatively-charged at low pH) show high SiCN/SiN removal rate (also referred to as "RR") and low $SiO_2$ RR on blanket test wafers (BTWs) and patterned test wafers (PTWs). In some embodiments, the slurry has a low pH. In some embodiments, the polishing is performed at a low pH. In some embodiments, the pH is adjusted with an organic acid. Small, surface-modified colloidal silica particles, which in some embodiments have a diameter of about 35 nm or less, about 20 nm or less, about 15 nm, below about 15 nm, or about 1 nm to about 15 nm, are utilized. In some embodiments, the slurry further comprises an additive, an organic acid, and a salt of an organic acid. In some embodiments, the polishing exhibits comparatively low oxide loss in BTWs and PTWs.

DETAILED DESCRIPTION

Definitions

Figure 1:
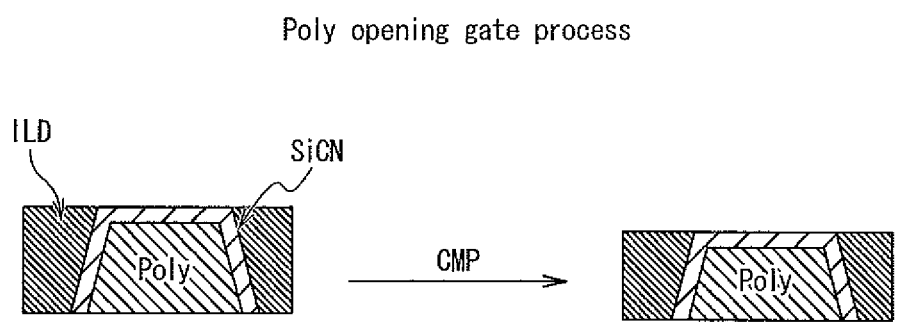
FIG. 1 illustrates one embodiment of polishing a SiCN film using a slurry provided herein. "Poly" refers to poly silicon (or polycrystalline silicon) and ILD refers to inter layer dielectric.

"a" or "an" include plural forms as the context indicates. For example, a pH adjustor means one or more pH adjustors.

"About" refers to ±1%, ±5%, or ±10% of a quantity, as the context indicates. As used herein, every amount, number, and ranges of each thereof are preceded by the term "about," unless the context dictates otherwise.

"Blanket test wafer" or "BTW" refers to wafers including a series of one or more films fabricated on bare silicon wafers. Common films can include $SiO_2$, SiN, carbides (such as SiC or SiCN), different types of metals such as tantalum, copper and aluminum, and other materials. Since they are typically less expensive than patterned test wafers or device wafers, they can provide a cost effective means of performing process analysis on silicon wafer substrates. BTWs may be used for testing etch rates and uniformities, measuring cleaning effectiveness, characterizing deposition uniformity and coverage, and evaluating other process parameters. BTWs are also used to setup and calibrate equipment.

"Patterned test wafer" or "PTW" refers to wafers used, e.g., to develop new wafer fabrication processes and maintain existing ones. PTWs differ from BTWs so as to include additional process steps to create patterns on the BTWs. The steps may include, applying a photoresist, followed by patterning of the resist using a photomask. The exposed resist is developed, leaving behind a die pattern on the wafer. The die pattern can include test structures, including lines, spaces, holes and different features. A typical test pattern may contain several arrays with features of different sizes and spacings. PTWs can simulate the behavior of device wafers used by fab end user customers.

"Soft pad" refers to polishing pads made of soft materials. An illustrative and nonlimiting soft pad has a pad with a Shore D<35D or Shore A<70A.

Methods and Composition

In one aspect, provided herein is a method for polishing a wafer, the method comprising: polishing the wafer with a slurry. In the method the wafer comprises at least one of silicon carbonitride (SiCN) and silicon nitride (SiN), and further comprises one or both of $SiO_2$ and poly silicon, and the slurry comprises up to about 0.5 wt % of a surface-modified colloidal silica, which has an average primary particle diameter of less than about 35 nm and the surface-modified colloidal silica comprises a plurality of acid moieties or salts thereof. In some embodiments, the method provides a removal rate of SiCN greater than a removal rate of poly silicon, and the removal rate of poly silicon greater than a removal rate of $SiO_2$.

In one embodiment, a ratio of a removal rate on a blanket test wafer (RRBTW) to a removal rate on a patterned test wafer (RRPTW) for SiN is greater than 1, and a ratio of RRBTW to RRPTW for SiCN is less than 1.

In one embodiment, the polishing is performed with a soft polisher or soft pad. In one embodiment, the ratio of removal rate (RR) of SiCN using a soft pad to that using a hard pad is about 1.2 to about 3 or about 1.5 to about 2 or is greater than about 1.

In some embodiments, the surface-modified colloidal silica particles are negatively charged. When the surface-modified colloidal silica particles are negatively charged, a removal rate of $SiO_2$ is moderated. When the colloidal silica is not surface modified, a removal rate of $SiO_2$ is not moderated compared to that of surface-modified colloidal silica.

In some embodiments, the slurry further comprises one or more of an additive, an organic acid, and a salt of an organic acid. The examples of the additive include surfactants.

Silicon carbide (SiC) with little or no nitrogen-doping also can be polished by the slurry provided herein. In some embodiments, polishing the wafer is carried out using a soft pad to achieve high removal rates of SiCN, high selectivity in removal rates of SiCN, or both. The use of soft pads is unexpected as SiCN is a hard material, and hard pads are typically used to increase removal rates of hard materials.

In some embodiments, the removal rate (RR) of SiCN is about 500 Å/min to about 1000 Å/min, about 1000 Å/min or more, about 500 Å/min to about 600 Å/min, or about 500 Å/min or more. In another embodiment, the removal rate of silica, such as tetraethoxysilane (TEOS), is about 1000 Å/min or less, or about 250 Å/min to about 1000 Å/min, or about 50 Å/min or less. In one embodiment, the ratio of RR of SiCN to that of TEOS is about 1 to about 100, or about 1 to about 4, or about 10 to about 100.

In one embodiment, the wafer is a patterned test wafer or a blanket test wafer.

In some aspects, provided herein are slurries for chemical mechanical polishing (CMP) of SiCN or SiN based on colloidal silica particle for selectively removing and polishing SiCN over TEOS.

In such an aspect provided herein is a polishing slurry comprising up to about 0.5 wt % of a surface-modified colloidal silica, which has an average primary particle diameter of less than about 35 nm, and the surface-modified colloidal silica comprises a plurality of acid moieties or salts thereof. The slurry demonstrates one or both of: a ratio of a removal rate on a blanket test wafer (RRBTW) to a removal rate on a patterned test wafer (RRPTW) for silicon nitride (SiN) that is greater than 1, and a ratio of RRBTW to RRPTW for silicon carbonitride (SiCN) that is less than 1.

In one embodiment, the slurry further comprises an additive. In some embodiments, a slurry comprising the additive demonstrates increased selectivity of SiCN RR over that of $SiO_2$, such as TEOS. In one embodiment, the ratio of the removal rate of SiCN to that of $SiO_2$ is up to about 4, up to about 3, or up to about 1.5. In some other embodiments, additives are employed to control poly silicon removal rates. In some embodiments, the poly silicon RR is suppressed compared to SiCN RR upon the inclusion of an additive.

In one embodiment, the SiCN contains about 20 wt % or less, or about 10 wt % or less of nitrogen while the rest is SiC.

In some embodiments, certain compositions, such as point of use (POU) compositions, are prepared by diluting a composition, also provided herein, 4 to 10 folds or more, using a dilution liquid, such as an aqueous solution or water.

Other polishing compositions and methods of making and using them are described in WO 2012/026329 (incorporated herein by reference), which can be appropriately modified and adapted in view of this disclosure to provide other compositions of this disclosure, and other methods of making and using such compositions and those described herein.

Silica

In one embodiment, the slurry comprises up to about 15 wt %, up to about 5 wt %, up to about 2 wt %, about 0.01 wt % to about 5 wt %, about 0.01 wt % to about 0.5 wt %, about 0.01 wt % to about 0.1 wt %, about 0.1 wt %, about 0.1 wt % to about 0.5 wt %, or about 0.5 wt % of the surface-modified colloidal silica particles. These specified ranges can be for POU compositions, such as after suitable dilutions. In some embodiments, the selectivity is controlled by adjusting the concentration of various components utilized herein, such as, e.g., surface-modified colloidal silica particles. In the methods provided herein, in certain embodiments, abrasive concentration used for SiCN polishing are lower than those for polishing SiN to achieve comparable removal rates. As the content of the surface-modified colloidal silica particles decreases, the selectivity of SiCN RR over that of $SiO_2$ tends to increase.

In one embodiment, the surface-modified colloidal silica particles have an average primary particle diameter of about 35 nm or less, about 20 nm or less, about 15 nm or less, about 10 nm or less, about 5 nm or less, or about 1 nm to about 15 nm. The use of small particles is unexpected as SiCN is a hard material, and larger particles are typically used to remove hard materials. In other embodiments, the average particle diameter of the surface-modified colloidal silica particles is 300 nm or less, 150 nm or less, 120 nm or less, or 100 nm or less. The average particle diameter of the surface-modified colloidal silica particles is determined based on the specific surface area of the surface-modified colloidal silica particles, for example, based on a BET adsorption method, or can be determined, for example, by light scattering measurements using laser.

In another embodiment, the surface-modified colloidal silica particles are of a non-globular or non-spherical form. As for surface-modified colloidal silica particles of a non-spherical shape, two or more primary particles may join. As for the average degree of association of the surface-modified colloidal silica particles, in certain embodiments, it is 1.2 or more or 1.5 or more. In other embodiments, the average degree of association of the surface-modified colloidal silica particles is 4.0 or less, 3.0 or less or 2.5 or less.

In one embodiment, the surface-modified colloidal silica particle comprises silica derivatized with 1-6, 2-5, or 3-4, organic acids or salts thereof bound to each particle. In one embodiment, the acid moieties of the surface-modified colloidal silica particles are selected from a carboxylic acid and a sulfonic acid. Methods of covalently attaching such organic acids to the silica such that a functional group of the organic acids is bound to the silica will be understood by the skilled artisan. For example, in case of covalently attaching a sulfonic acid, which is one kind of the organic acids, to the colloidal silica, see Cano-Serrano et al., "Sulfonic acid-functionalized silica through quantitative oxidation of thiol groups", Chem. Commun., 2003, 246-247. Specifically, the colloidal silica in which sulfonic acids are covalently attached to its surface is obtained by coupling silane coupling agents having a thiol group such as (3-Mercaptopropyl) trimethoxysilane with the colloidal silica and then oxidizing the thiol group using a hydrogen peroxide in water. Alternatively, for example, in case of covalently attaching a carboxylic acid to the colloidal silica, see "Novel silane coupling agents containing a photolabile 2-nitrobenzyl ester for introduction of a carboxy group", Yamaguchi et al., Chemistry Letters, 3, 228-229 (2000). Specifically, the colloidal silica in which a carboxylic acid is covalently attached to its surface is obtained by coupling silane coupling agents containing photosensitive 2-nitrovinzyl ester with the colloidal silica and then irradiating it by light.

Slurry pH

In one embodiment, the slurry has a pH of less than about 6, such as a pH of about 2 to about 5, or less than about 5, or about 2 to about 4. In other embodiments, the pH is 5 or less, 4 or less, or 4.5 or less. In other embodiments, the pH is 1 or more, 1.5 or more, or 2.5 or more. In one embodiment, the pH is about 3. In some embodiments, the removing rate of SiCN increases with lower slurry pH value.

A pH adjuster may be used for adjusting the pH of the composition to a desired value. The pH adjuster used may be an inorganic acid or an organic acid, or may be a chelating agent. For example, and without limitation, such inorganic acids include hydrochloric acid, sulfuric acid, nitric acid, boric acid, carbonic acid, hypophosphorous acid, phosphorous acid, and phosphoric acid.

For example, and without limitation, such organic acids include formic acid, acetic acid, propionic acid, butanoic acid, valeric acid, 2-methylbutyric acid, N-hexanoic acid, 3,3-dimethylbutanoic acid, 2-ethylbutanoic acid, 4-methylpentanoic acid, n-heptanoic acid, 2-methyl hexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citrate, lactic acid, diglycolic acid, 2-furancarboxylic acid, 3-furancarboxylic acid, 2-tetrahydro furancarboxylic acid, methoxy acetic acid, methoxyphenyl acetic acid, and phenoxyacetic acid. Such organic acids also include, without limitation, organic sulfonic acid, such as methanesulfonic acid, ethane sulfonic acid, and isethionic acid.

In other embodiments, salts, such as ammonium salts of inorganic acids or organic acids and alkaline metal salts, such as potassium salts, and alkaline earth metal salts may be used as a pH adjuster in combination with one or more inorganic acids or organic acids.

Examples of chelating agents include, without limitation, hydroxy ethylimino-2-acetic acid, an iminodiacetic acid, an acetamide iminodiacetic acid, nitrilo-3-propanoic acid, nitrilo-3-methylphosphonic acid, nitrilotriacetic acid, a diethylenetriamine pentaacetic acid, and ethylenediaminetetraacetic acid.

In one embodiment, an organic acid such as lactic acid or another organic acid is present in an amount that is 0.001 to 1%, 0.01 to 0.1%, or 0.09% by mass with respect to the composition.

Additives

In some embodiments, the additive utilized herein is a surfactant. In some embodiments, the surfactant is a nonionic surfactant. Non-limiting and illustrative examples of nonionic surfactants include polyethylene glycol oleyl ether, polyethylene glycol hexadecyl ether, polyethylene glycol octadecyl ether, polyethylene glycol dodecyl ether, polyethylene glycol tridecyl ether, and the likes. In some embodiments, the surfactant is an anionic surfactant. Nonlimiting and illustrative examples of anionic surfactants include polyoxyethylene octyl ether carboxylic acid, polyoxyethylene oleyl ether carboxylic acid, polyoxyethylene lauryl ether carboxylic acid, glycolic acid ethoxylate lauryl ether, and the likes. In some embodiments, the surfactant is a cationic surfactant. Non-limiting and illustrative examples of cationic surfactants include hexadecyltrimethylammonium halide, dodecyltrimethylammonium halide, decyltrimethylammonium halide, myristyltrimethylammonium halide, and the likes. In some embodiments, the halide is chloride or bromide.

In another embodiment, the surfactant is present in an amount by mass of the polishing composition of equal to or greater than 0.01%, or present in an amount of equal to or greater than 0.02%. In addition, the surfactant is present in an amount by mass of the polishing agent of equal to or less than 2%, or present in an amount of equal to or less than 1%.

In some embodiments, the compositions provided herein further comprise oxidizers, such as hydrogen peroxide, or an antiseptic or an antifungal agent. Nonlimiting examples of antiseptic and antifungal agents include isothiazoline system antiseptics, such as 2-methyl-4-isothiazoline-3-one and 5-chloro-2-methyl-4-isothiazoline 3-one, p-hydroxybenzoate esters, and phenoxyethanol.

In another embodiment, the oxidizer is present in an amount by mass of the polishing composition of equal to or greater than 0.1%, or present in an amount of equal to or greater than 0.5%. In addition, the oxidizer is present in an amount by mass of the polishing composition of equal to or less than 4%, or present in an amount of equal to or less than 3%. When the amount of the oxidizer is less than 0.1% or exceeds 4% in some embodiments, it tends to be difficult to obtain the SiCN polishing speed in a practical level.

In another embodiment, the compositions provided herein further comprise a corrosion inhibitor. In another embodiment, the corrosion inhibitor is a heterocyclic or complex aryl compound containing at least a five- or six-membered ring, two or more double bonds, and one or more nitrogen atoms. Non-exclusive examples include a compound containing a pyridine ring, a pyrazole ring, a pyrimidine ring, an imidazole ring, a triazole ring or a benotriazole ring. In another embodiment, the corrosion inhibition factor is a benzotriazole (BTA).

In another embodiment, the corrosion inhibitor is present in an amount by mass of the polishing composition of equal to or greater than 0.1%, or present in an amount of equal to or greater than 0.2%. In addition, the corrosion inhibitor is present in an amount by mass of the polishing composition of equal to or less than 0.4%, or equal to or less than 0.3%. If the amount of the corrosion inhibitor is less than 0.1% or exceeds 0.4% in some embodiments, it tends to be difficult to obtain a corrosion suppression effect in a practical level.

Surface Characterizations

Surface studies of surfaces polished according to the present technology show surface roughness improvement upon polishing. According to certain embodiments, the compositions and methods provide post-polish film surfaces that are smoother than pre-polish surfaces. For example, and without limitation, for a SiCN film, the roughness (RMS, Å) decreased post-polish to 1.5±0.1 from 5.2±0.3.

Without being bound by theory, the result from XPS and contact angle analysis shows that hydration of SiCN may be responsible for SiCN removal rate modulation. Contact angle measurement with a goniometer shows that the SiCN surface becomes hydrophilic after polishing with slurries utilized and provided herein, indicating the presence of Si—OH moieties after polishing. SiCN surface is initially hydrophobic with Si—C and Si—N groups on the surface. However, after polishing test, Si—O bonds were observed, and the surface became hydrophilic.

General Procedure for Preparing Composition and Measuring Polishing Speed

Generally, the abrasive and the additive are blended in water, and pH of the composition is appropriately adjusted by a pH adjuster (such as potassium hydrate or ammonia). Although a temperature when the respective constituents are blended is not particularly limited, the temperature is preferably from 10° C. to 40° C., and heating may be performed for an increase in a speed of dissolution. In addition, the blending time is not particularly limited.

As a polishing apparatus, it is possible to use a general polishing apparatus, to which a holder for holding a substrate with a polishing target, a motor capable of rotating in different numbers of rotations, and the like are attached, which includes a polishing disk with an attachable polishing pad (polishing cloth).

Polishing conditions are not particularly limited, and for example, the rotation speed of the polishing disk is preferably from 10 rpm to 500 rpm, and the pressure (polishing pressure) to be applied to the substrate with the polishing target is preferably from 0.5 psi to 10 psi. A method of supplying the polishing composition to the polishing pad is not particularly limited, and for example, a method of sequentially supplying the polishing composition with a pump or the like is employed. Although the supply amount thereof is not particularly limited, it is desirable that the surface of the polishing pad be constantly covered with the polishing composition of the present disclosure.

The substrate is obtained by washing the substrate with flowing water after the polishing, blowing water droplets adhering to the substrate, and drying the substrate with a spin drier or the like.

The wafer is polished for a predetermined time, and a surface polishing speed of other wafers in the Examples is measured. Removal rate of a SiCN or another surface as described herein is measured based on grinding a wafer for a period of time. The removal rate is calculated by measuring the difference of the thickness of the wafer before and after the polish, and the polishing time. The film thickness is measured using, for example, spectroscopic ellipsometry or dual-beam spectrophotometry.

EXAMPLES

Example 1

The surfaces of TEOS, poly silicon, and SiCN wafers having a diameter of 200 mm were polished with each of sample A shown in Table 1 as a polishing composition at a slurry flow rate of the polishing composition of 250 mL/min, a pressure of polishing of 2.0 psi, and a platen rotation speed of 127 rpm, while using a soft pad (Shore Hardness A 63). The removal rate of each of the wafers is shown in Table 1. Note that the average primary particle size of the colloidal silica is 35 nm and that the colloidal silica particles contain covalently bound sulfonic acid.

It has been found that in case of sample A, a removal rate of SiCN is greater than a removal rate of poly silicon and the removal rate of poly silicon is greater than a removal rate of TEOS.

TABLE 1

|  | Colloidal silica | Organic Acid | pH | RR of SiCN | RR of Poly Si | RR of TEOS |
|---|---|---|---|---|---|---|
| Smp. A | Surface-Modified 0.5 wt % | Lactic Acid 0.09 wt % | 3.0 | 529 | 101 | 5 |

RR: Å/min

Example 2

The surfaces of TEOS and SiCN wafers having a diameter of 200 mm were polished with each of samples 1 to 3 shown in Table 2 as a polishing composition at a slurry flow rate of the polishing composition of 250 mL/min, a pressure of polishing of 2.0 psi, and a platen rotation speed of 127 rpm, while using a soft pad (Shore Hardness A 63). The removal rate of each of the wafers is shown in Table 2. Note that the average primary particle size of the colloidal silica is 35 nm and that the colloidal silica particles contain covalently bound sulfonic acid.

It has been found that in case of samples 1 to 3, a removal rate of SiCN is greater than a removal rate of TEOS.

TABLE 2

|  | Colloidal silica | Organic Acid | Organic Salt | pH | RR of SiCN | RR of TEOS |
|---|---|---|---|---|---|---|
| Smp. 1 | Surface-Modified 4.0 wt % | Citric Acid 0.27 wt % | Ammonium Citrate 0.56 wt % | 4.4 | 1000 | 220 |
| Smp. 2 | Surface-Modified 2.0 wt % | Citric Acid 0.47 wt % | Ammonium Citrate 0.19 wt % | 4.2 | 1100 | 390 |
| Smp. 3 | Surface-Modified 4.0 wt % | Citric Acid 0.07 wt % | Ammonium Citrate 0.56 wt % | 4.2 | 980 | 700 |

RR: Å/min

Example 3

The surfaces of a blanket test wafer (BTW) and a patterned test wafer (PTW) having a diameter of 200 mm were polished with each of samples 4 to 5 shown in Table 3 as a polishing composition at a slurry flow rate of the polishing composition of 250 mL/min, a pressure of polishing of 1.5 psi, and a platen rotation speed of 100 rpm, while using a soft pad (Shore Hardness A 63). The removal rate of SiN and SiCN in each of the test wafers is shown in Table 3. Note that the colloidal silica particles contain covalently bound sulfonic acid.

It has been found that a ratio of a removal rate on a blanket test wafer (RRBTW) to a removal rate on a patterned test wafer (RRPTW) for silicon nitride (SiN) is greater than 1, and a ratio of RRBTW to RRPTW for silicon carbonitride (SiCN) is less than 1.

TABLE 3

|  | Colloidal silica | | | | RR of SiN in RRBTW | RR of SiN in PRPTW | RR of SiCN in PRBTW | RR of SiCN in PRPTW |
|---|---|---|---|---|---|---|---|---|
|  | Primary particle size (nm) | Content (wt %) | Organic Acid | pH | | | | |
| Smp. 4 | 35 | 0.5 | Citric Acid 0.09 wt % | 4.7 | 408 | 473 | 468 | — |
| Smp. 5 | 35 | 0.1 | Citric Acid 0.09 wt % | 4.7 | 254 | — | 277 | 404 |
| Smp. 6 | 15 | 0.5 | Citric Acid 0.09 wt % | 4.7 | 334 | 276 | 271 | 438 |

TABLE 3-continued

| | Colloidal silica | | | | RR of SiN in RRBTW | RR of SiN in PRPTW | RR of SiCN in PRBTW | RR of SiCN in PRPTW |
|---|---|---|---|---|---|---|---|---|
| | Primary particle size (nm) | Content (wt %) | Organic Acid | pH | | | | |
| Smp. 7 | 15 | 0.1 | Citric Acid 0.09 wt % | 4.7 | 246 | — | 188 | 278 |

RR: Å/min

Example 4

The surfaces of SiCN including 10% N and SiCN including 18% N wafers having a diameter of 200 mm were polished using the slurry containing the surface-modified colloidal silica 4.0 wt %, maleic acid 0.14 wt %, and ammonium sulfate 0.5 wt % with pH 2.9 as a polishing composition at a slurry flow rate of the polishing composition of 250 mL/min, a pressure of polishing of 2.0 psi, and a platen rotation speed of 127 rpm, while using a soft pad (Shore Hardness A 63) and a hard pad (Shore Hardness D 57). The removal rate of each of the wafers is shown in Table 4. Note that the average primary particle size of the colloidal silica is 35 nm and that the colloidal silica particles contain covalently bound sulfonic acid.

It has been found that the selectivity SiCN including 18% N to SiCN including 10% N in case of using a soft pad is higher than that in case of using a hard pad.

TABLE 4

| | RR of SiCN (10% N) | RR of SiCN (18% N) |
|---|---|---|
| Soft pad | 980 | 1300 |
| Hard pad | 590 | 740 |

RR: Å/min

Example 5

The surfaces of SiCN wafers having a diameter of 200 mm were polished using the slurries containing the surface-modified colloidal silica 4.0 wt %, lactic acid 0.07~0.21 wt % and ammonium salt 0.31~0.62 wt % with pH 3 to 7.2 at a slurry flow rate of the polishing composition of 250 mL/min, a pressure of polishing of 2.0 psi, and a platen rotation speed of 127 rpm, while using a soft polymetric polyurethane pad (Shore Hardness A 63). Note that the average primary particle size of the colloidal silica is 35 nm and that the colloidal silica particles contain covalently bound sulfonic acid.

Figure 2:
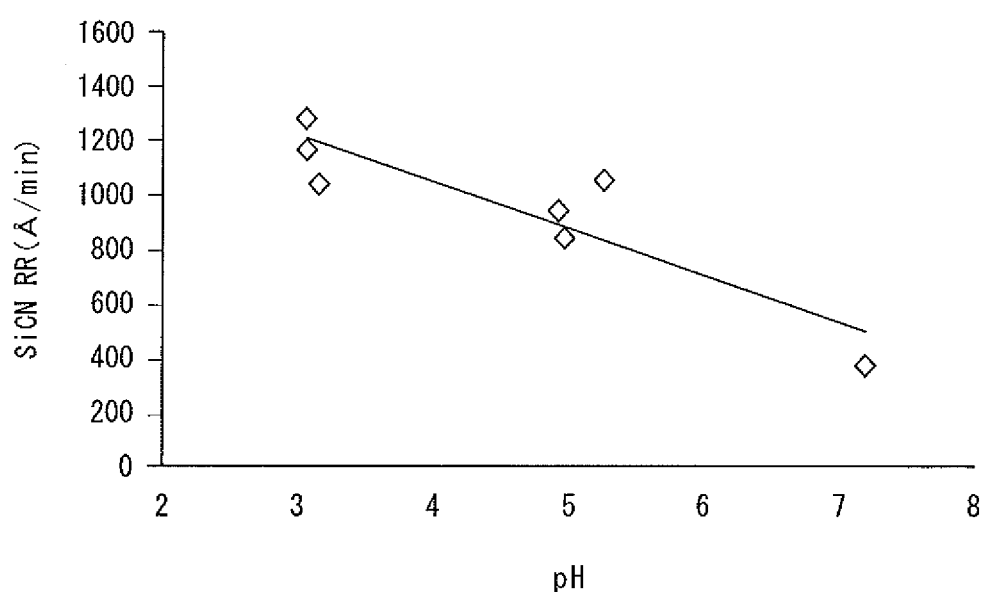
FIG. 2 graphically illustrates the pH dependence of the removal rate of SiCN by a slurry in certain embodiments of the present technology. The slurries in the graph contain surface modified silica particles, an organic acid, and an organic salt.

The result of the removal rate of each wafer is shown in FIG. 2. It has been found that the removal rate of SiCN increases with lower slurry pH value.

Example 6

The surfaces of poly silicon and SiCN wafers having a diameter of 200 mm were polished with each of samples C and D shown in Table 5 as a polishing composition at a slurry flow rate of the polishing composition of 250 mL/min, a pressure of polishing of 2.0 psi, and a platen rotation speed of 127 rpm, while using a soft pad (Shore Hardness A 63). The removal rate of each of the wafers is shown in Table 5. Note that the average primary particle size of the colloidal silica is 35 nm and that the colloidal silica particles contain covalently bound sulfonic acid.

It has been found that the selectivity of SiCN to poly silicon in case of using a slurry containing additive (ammonium salt) is higher than that in case of using a slurry not containing additive (ammonium salt).

TABLE 5

| | Colloidal silica | Organic Acid | Additive (ammonium salt) | RR of SiCN | RR of Poly Si |
|---|---|---|---|---|---|
| Smp. C | Surface-Modified 4.0 wt % | Citric Acid 0.07 wt % | Ammonium citrate 0.28 wt % | 1020 | 287 |
| Smp. D | Surface-Modified 4.0 wt % | Citric Acid 0.07 wt % | | 960 | 195 |

RR: Å/min

The invention claimed is:

1. A polishing slurry comprising up to about 15 wt % of surface-modified colloidal silica particles,
   wherein the surface-modified colloidal silica particles have an average primary particle diameter of less than about 35 nm, and the surface-modified colloidal silica particles comprise a plurality of acid moieties or salts of the acid moieties,
   wherein the slurry demonstrates that a removal rate of silicon carbonitride (SiCN) is greater than a removal rate of silicon nitride (SiN), the removal rate of SiCN is greater than a removal rate of poly silicon, and the removal rate of poly silicon is greater than a removal rate of silica ($SiO_2$),
   wherein the slurry has a pH of less than about 6, and
   wherein the surface-modified colloidal silica particles are negatively charged.

2. The polishing slurry of claim 1, wherein the slurry demonstrates one or both of:
   a ratio of a removal rate on a blanket test wafer (RRBTW) to a removal rate on a patterned test wafer (RRPTW) for SiN that is greater than 1, and
   a ratio of RRBTW to RRPTW for SiCN that is less than 1.

3. The polishing slurry of claim 1, wherein the slurry further comprises one or more of an additive, an organic acid, and a salt of an organic acid.

4. The polishing slurry of claim 1, wherein the slurry comprises about 0.01 wt % to about 5 wt % of the surface-modified colloidal silica particles.

5. The polishing slurry of claim 1, wherein the slurry comprises about 0.01 wt % to about 0.5 wt % of the surface-modified colloidal silica particles.

6. The polishing slurry of claim 1, wherein the average primary particle diameter of the surface-modified colloidal silica particles is 20 nm or less.

7. The polishing slurry of claim 1, wherein the acid moieties are selected from a carboxylic acid and a sulfonic acid.

8. The polishing slurry of claim 1, wherein the slurry has a pH of less than about 5.

\* \* \* \* \*